United States Patent [19]

Goodfellow et al.

[11] Patent Number: 4,625,225
[45] Date of Patent: Nov. 25, 1986

[54] INTEGRATED LIGHT DETECTION OR GENERATION MEANS AND AMPLIFYING MEANS

[75] Inventors: Robert C. Goodfellow, Brackley; Andrew C. Carter, Greens Norton, both of England

[73] Assignee: Plessey Overseas Limited, Ilford, England

[21] Appl. No.: 387,348

[22] Filed: Jun. 11, 1982

[30] Foreign Application Priority Data

Jun. 13, 1981 [GB] United Kingdom ............... 8118258

[51] Int. Cl.[4] .................. H01L 27/14; H01L 31/10
[52] U.S. Cl. ................................ 357/30; 357/22; 357/23.4; 357/17; 357/41; 357/55; 357/4
[58] Field of Search ........... 357/23 NS, 22, 4, 30 D, 357/30 I, 30, 17, 55, 22 V, 22 E, 22 P, 22 G, 30 B, 30 C, 30 A, 30 E, 30 F, 30 G, 30 H, 30 I, 30 J, 30 M, 41

[56] References Cited

U.S. PATENT DOCUMENTS

| | | | |
|---|---|---|---|
| 4,075,651 | 2/1978 | James | 357/22 |
| 4,212,020 | 7/1980 | Yariv et al. | 357/4 |
| 4,274,104 | 6/1981 | Fang et al. | 357/30 |
| 4,346,395 | 8/1982 | Ouchi | 357/4 |
| 4,361,887 | 11/1982 | Nakamura et al. | 357/17 |

FOREIGN PATENT DOCUMENTS 53118988 10/1978 Japan ............................ 357/22 E

OTHER PUBLICATIONS

Mok et al., *IEEE Trans. on Elect. Dev.*, vol. ED-25, No. 10, Oct. 1978, "A V-Groove . . . Applications", pp. 1235-1240.
Leheny et al., *Electronics Lettrs.*, May 8, 1980 May 1980, vol. 16, No. 10, pp. 353-355, "Integrated . . . Photoreceiver".
Smith et al., Elec. Lett., Jan. 17, 1980, vol. 16, No. 2, pp. 69-71, "PIN/F.E.T. . . . Systems".
PAN, "GaAs . . . Detection" *Proceed of the SPIE vol. 150 Laser and Fiber Optics Common.* 1978, pp. 175-184.

*Primary Examiner*—Martin H. Edlow
*Assistant Examiner*—Jerome Jackson, Jr.
*Attorney, Agent, or Firm*—Fleit, Jacobson, Cohn & Price

[57] ABSTRACT

The invention relates to a monolithic light detector or generator integratd with an amplifier. The amplifier includes an F.E.T. comprising a substrate on which are formed source and drain contact layers separated by a groove. The gate layer is formed in the groove bridging the source and drain layers, and the optical system comprises additional layers formed on the substrate or formed on top of the gate layer with suitable conductive connections between the two.

6 Claims, 5 Drawing Figures

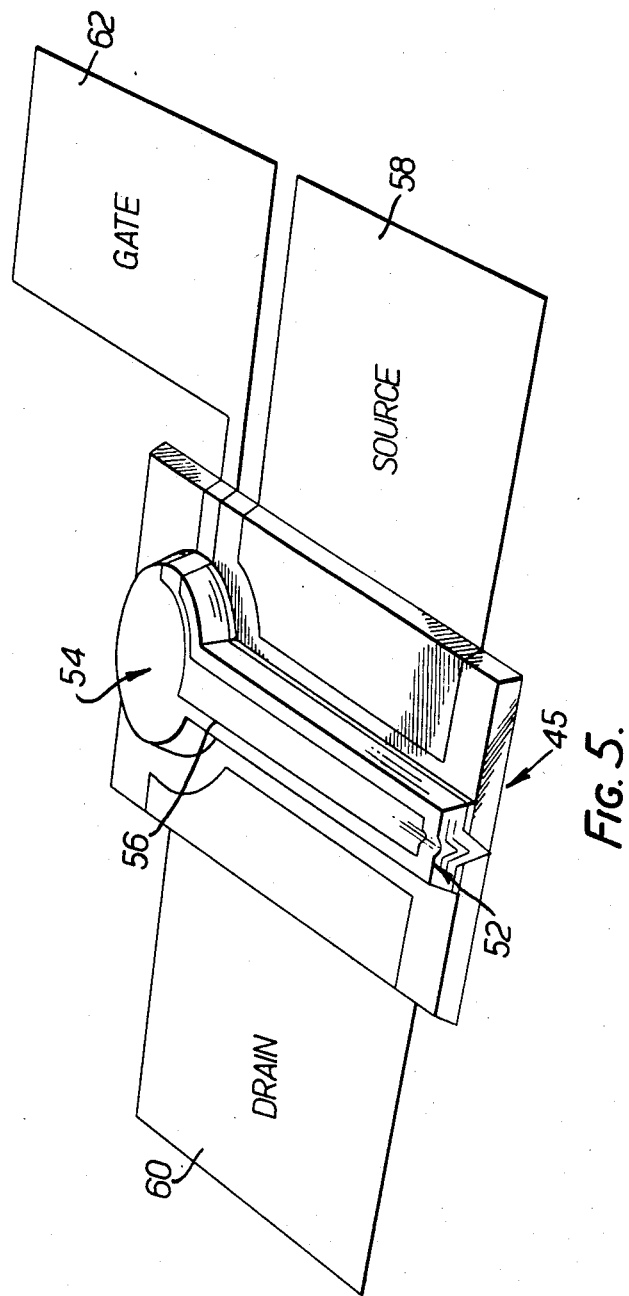

INTEGRATED LIGHT DETECTION OR GENERATION MEANS AND AMPLIFYING MEANS

FIELD OF THE INVENTION

This invention relates to integrated light detection or generating means and amplifying means and more particularly to light sources such as light emitting diodes, or light detectors such as photodiodes integrated with amplifiers such as field effect transistors, resistors and capacitors in various group III-V multilayer structures to form a monolithic structure.

The term "light" used herein includes invisible light such as infra-red and ultra violet.

DESCRIPTION OF THE PRIOR ART

Several such integrated systems are known in which an amplifier comprising a junction F.E.T. is formed in a localized diffusion step through a window in an oxide mask. The disadvantages of this method are that low doped layers are deteriorated during the diffusion drive in step and spreading during diffusion tends to lengthen the gate and so reduce the mutual conductance achievable.

OBJECTS AND SUMMARY OF THE INVENTION

It is an object of the present invention therefore to provide integrated light detection or generation means and amplifying means which will overcome these disadvantages.

According to the present invention integrated light detecting or generating means and amplifying means comprises a field effect transistor comprising a semi-insulating substrate on which are formed source and drain layers separated by a groove. A channel layer and a second layer on top of the channel layer form a gate structure in the groove bridging the source and drain layers, and light detecting means formed of the channel layer and the second layer to form a monolithic structure. Another embodiment of the present invention includes a light generating means instead of the light detecting means. The light generating means is formed by the channel layer and the second layer to form a monolithic structure.

The light detecting or generating means may be directly formed on the substrate but are preferably formed on the gate layer.

The light detecting layers preferably define a light detector such as a photo-diode.

Alternatively the light generating layers may define a light source such as a light emitting diode.

The source and drain layers preferably each comprise a buffer layer, high conductivity source and drain layers and a high resistance cover layer.

Preferably the light detector comprises a p-n photodiode consisting of p-type layers formed on the channel layer.

Preferably the groove between the source and drain layers is V shaped and the channel layer and the photodiode layers are formed in the groove.

The invention also comprises a method of making integrated light detecting or generating means and amplifying means comprising the steps of forming an FET high conductivity source/drain layer on a substrate, forming a groove in the layer produced to divide the layer into two parts, producing an FET channel layer in the groove to bridge the two layers and producing further layers forming light detecting or generating means.

The FET high conductivity source/drain layer is preferably formed by a first epitaxial growth step, and the FET channel layer and the further layers are preferably formed by a second epitaxial growth step.

The groove is preferably V shaped and formed by etching.

BRIEF DESCRIPTION OF THE DRAWINGS

An embodiment of the invention will now be described by way of example only with reference to the accompanying drawings in which FIG. 4 is a perspective view of a completed FET integrated with a separate detector diode and FIG. 5 is a perspective view of a completed FET integrated with a detector diode formed on top of the FET.

DESCRIPTION OF THE PREFERRED EMBODIMENTS

Figure 1:
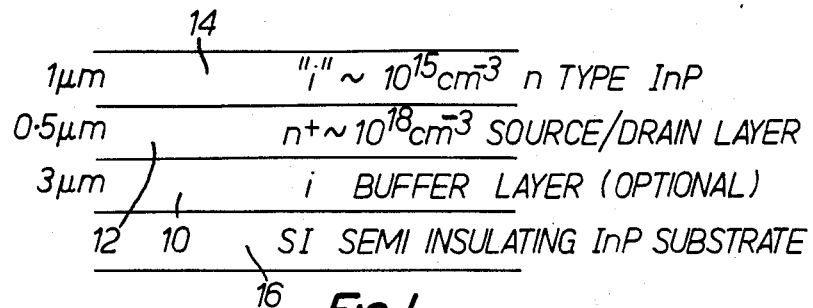
FIGS. 1 to 3 illustrate sequentially the steps of producing an integrated photodiode and FET amplifier according to the invention.
Figure 2:
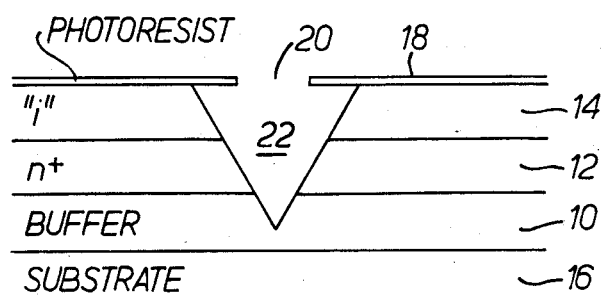
Figure 3:
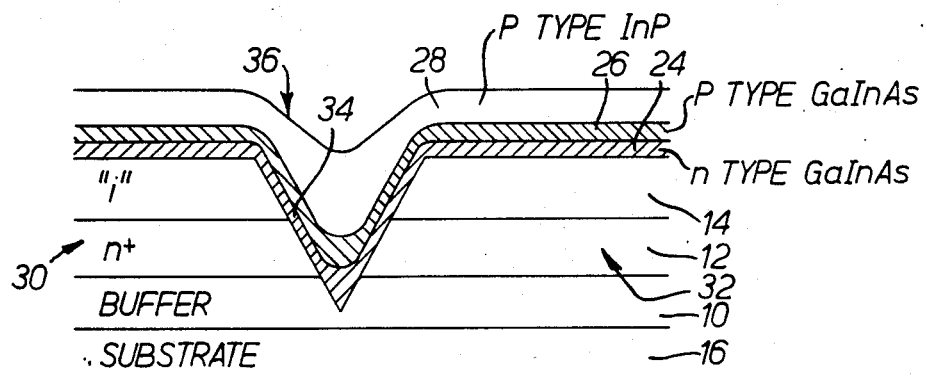

A method of making simultaneously a photodiode and a short gate junction FET on a semi-insulating InP substrate 16 is illustrated in FIGS. 1 to 3.

An FET buffer layer 10, a high conductivity n+ source/drain layer 12 and a high resistance n type cover layer 14 are grown in a single epitaxial growth step. The layer sequence is shown in FIG. 1.

The layer 14 is then covered by a layer of photoresist 18 and slot 20 of ~1 μm is opened in the layer 18. The layers 10, 12 and 14 are then etched using a crystal orientation dependent etch to produce a V groove 22 to a depth such that the apex of the V groove divides the high conductivity n+ source/drain contact layer 12. See FIG. 2.

The remainder of the photoresist layer is then removed and in a second epitaxial growth step the following layers are deposited: an n type GaInAs layer 24, a p type GaInAs layer 26 and a p type InP layer 28. These are deposited conformally so that the GaInAs layer 24 bridges the gap in the n+ layer 12.

Figure 4:
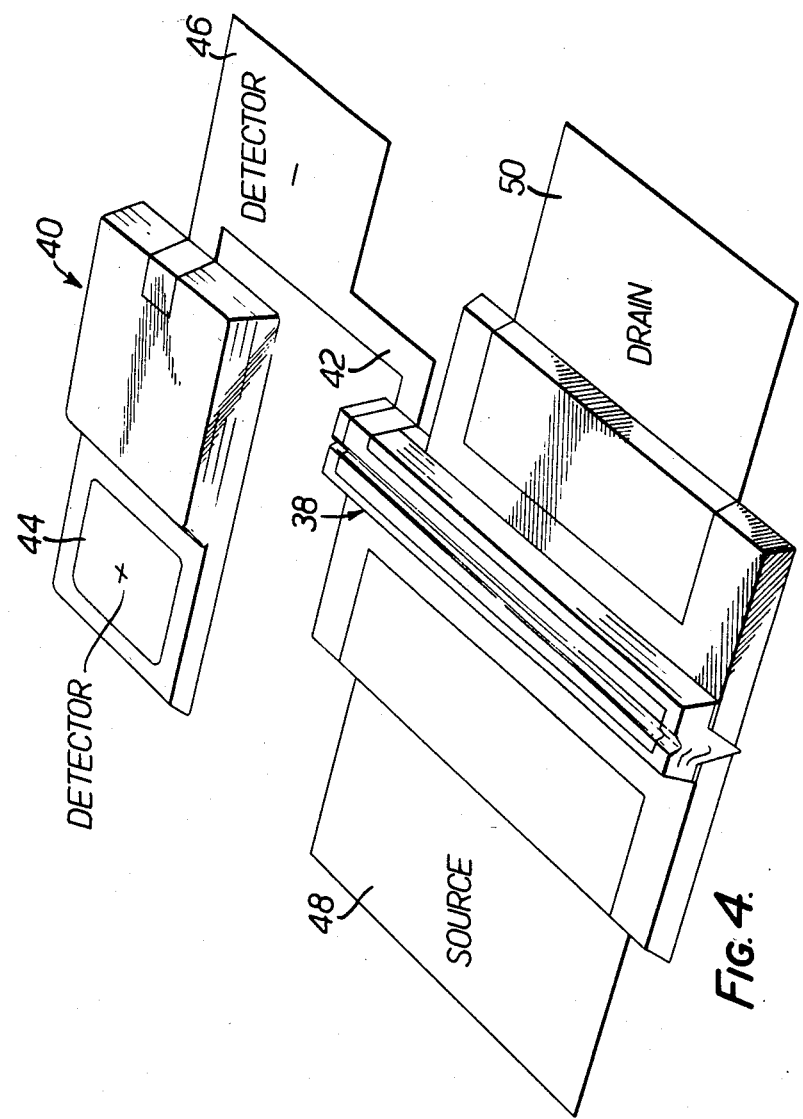

Carefully controlled depth etching through photoresist patterns is performed to define a source 30, a drain 32, channel 24, and gate layers 26 and 28 to define a separate diode 36 comprising p type InP 28, p type GaInAs 26, n type GaInAs 24, i type InP 14, and n type Inp 12, either detached from the FET as shown in FIG. 4 or on top of it as part of the gate as shown in FIG. 3. FIG. 3 illustrates a channel layer 24 and a second layer 26 on top of the channel layer thereby forming at least a gate structure over the substrate.

An insulating layer e.g. SiO$_2$ (not shown) is deposited, windows are opened by photoengraving and n and p type metallisations are applied using engraving and float-off techniques. The oxide is needed to isolate interconnections and these are taken over appropriate mesa edges to preserve electrical continuity.

The scheme shown does not easily allow the inclusion of high value resistors so a resistor deposition stage is needed for most useful integration.

The 'V' groove infilled gate FET has short (submicron) gate lengths so that high gm's or high mutual conductance result.

The thin n FET layer 24 is controllably infilled so that the high conductivity materials necessary for high gm may be utilized.

The infilled FET layer 24 is GaInAs which has excellent transport properties for FET's.

The important gate/drain and gate/source capacitances which are likely to be higher than that of a MESFET may be reduced because of the high resistance layer grown onto the source/drain n+ LAYER 12.

Layers 24 and 26 form a detector whose structure can be tailored to that required for good optical coupling. The light detector is formed by layer 34 and layer 26.

Detection out to 1.6 μm can be achieved in the heterostructure detection layer.

Both photofets and integrated diode-FETs are realizable using this method.

Infilling by liquid phase epitaxy produces thicker layers on concave regions of the surface. This means that to fully pinch off the FET in the apex of the 'V' sufficient negative bias is needed to significantly deplete the layer 14 so reducing the source/drain to gate capacitance.

The detector diode structure is ppnin+ which behaves as a p-i-n- structure once the central n and i layers 12, 14 have been fully depleted.

FIG. 4 illustrates a junction FET 38 integrated with a separate detector diode 40, the detector being connected to the gate of the FET by a metallic conductor 42. Metallic contact pads, detector pad 44, detector pad 46, source pad 48 and drain pad 50, are provided for the input and output to the diode and the source and drain of the FET. The cross section of FET 38 is substantially similar to that illustrated in FIGS. 1-3 and described above.

FIG. 5 illustrates a junction FET 52 integrated with a photodiode 54 which is mounted directly on the gate 56 of the FET. Again contact pads 58, 60 are provided for the source and drain, and a further contact pad 62 is provided which is connected to the gate of the FET.

Whilst an integrated FET and a photodiode has been described the invention is equally applicable to an integrated FET and a light source, such as an LED. As used herein, the term "photo semiconductor diode" is meant to encompass a semiconductor diode which is either photoreceptive or photoemissive.

What we claim is:

1. An integrated circuit device comprising: a common substrate of semi-insulating material; a field effect transistor and a photo semiconductor diode formed on said substrate, said field effect transistor being integrated with said photo semiconductor diode;

said field effect transistor including:

a first layer of dopant enriched semiconductor material of first conductivity type overlayed upon said substrate, said first layer being divided into a source region and a drain region by a groove which extends at least the full depth of said first layer, the source and drain regions being adjacent respective walls of said groove; and an infill structure including a second layer of first conductivity type, a third layer of second conductivity type, a first portion of said second layer lying inside said groove adjacent said walls of said groove and providing a conductive channel connecting said source and drain regions, a first portion of said third layer being spaced from said walls of said groove, lying adjacent said first portion of said second layer, said third layer providing a gate for controlling the flow of carriers through said channel between said source region and said drain region;

said photo semiconductor diode including:

a plurality of layers of semiconductor material including a second portion of said second layer lying below a second portion of said third layer, said second portions of said second and third layers being co-deposited with said first portions thereof onto the substrate.

2. A device, as claimed in claim 1, wherein said first portions of said second and third layers are detached from said second portions thereof corresponding to said photo semiconductor diode, and the device including a common electrode connecting said gate of said transistor to said photo semiconductor diode.

3. A device, as claimed in claim 1, wherein said first portion of said third layer is an integral part of said second portion of said third layer which is one of said plurality of layers of said photo semiconductor diode.

4. A device, as claimed in claim 1, said first layer having thereover a cover layer of intrinsic material, the photo semiconductor diode being comprised of: layers corresponding to said third and second layers, a layer corresponding to said cover layer, and a layer corresponding to said first layer, the totality of said layers of said photo semiconductor diode providing a p-i-n equivalent diode structure.

5. A device, as claimed in claim 1, having a heterostructure, wherein said first and second layers are of non-identical chemical species, and wherein said second layer is the same chemical species as the third layer.

6. A device, as claimed in claim 5, wherein said first layer is composed of indium phosphide, and said second and third layers are composed of gallium indium arsenide material.

* * * * *